(12) United States Patent
Lin et al.

(10) Patent No.: US 10,483,395 B2
(45) Date of Patent: Nov. 19, 2019

(54) METHOD FOR FABRICATING SEMICONDUCTOR DEVICE

(71) Applicant: UNITED MICROELECTRONICS CORP., Hsin-Chu (TW)

(72) Inventors: Chun-Hao Lin, Kaohsiung (TW); Hsin-Yu Chen, Nantou County (TW); Shou-Wei Hsieh, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/849,599

(22) Filed: Dec. 20, 2017

(65) Prior Publication Data
US 2019/0157443 A1    May 23, 2019

(30) Foreign Application Priority Data

Nov. 23, 2017 (CN) .......................... 2017 1 1183881

(51) Int. Cl.
| H01L 29/78 | (2006.01) |
| H01L 21/02 | (2006.01) |
| H01L 21/027 | (2006.01) |
| H01L 21/762 | (2006.01) |

(52) U.S. Cl.
CPC ........ H01L 29/785 (2013.01); H01L 21/0271 (2013.01); H01L 21/02164 (2013.01); H01L 21/02304 (2013.01); H01L 21/762 (2013.01)

(58) Field of Classification Search
None
See application file for complete search history.

(56) References Cited

U.S. PATENT DOCUMENTS

| 7,947,551 | B1 | 5/2011 | Syue et al. | |
| 9,130,014 | B2 | 9/2015 | Lin et al. | |
| 9,312,188 | B2* | 4/2016 | Kim | H01L 21/82380 |
| 9,514,990 | B2* | 12/2016 | Liu | H01L 21/823431 |
| 9,865,710 | B2* | 1/2018 | Liu | H01L 29/66545 |
| 10,121,880 | B2* | 11/2018 | Mao | H01L 21/31053 |
| 2007/0212874 | A1 | 9/2007 | Sandhu | |
| 2010/0197096 | A1* | 8/2010 | Johnson | H01L 21/823431 |
| | | | | 438/268 |
| 2014/0370672 | A1* | 12/2014 | Kim | H01L 21/82380 |
| | | | | 438/217 |
| 2015/0076617 | A1* | 3/2015 | Kim | H01L 21/3081 |
| | | | | 257/392 |
| 2016/0190142 | A1* | 6/2016 | Kim | H01L 21/82380 |
| | | | | 438/231 |
| 2016/0233088 | A1* | 8/2016 | Feng | H01L 21/2256 |
| 2016/0315085 | A1* | 10/2016 | Choi | H01L 27/0924 |
| 2017/0200810 | A1* | 7/2017 | Mao | H01L 21/31053 |
| 2017/0278928 | A1* | 9/2017 | Tung | H01L 29/785 |

* cited by examiner

Primary Examiner — Telly D Green
(74) Attorney, Agent, or Firm — Winston Hsu

(57) ABSTRACT

A method for fabricating semiconductor device includes the steps of: providing a substrate having a first region and a second region; forming a first fin-shaped structure on the first region and a second fin-shaped structure on the second region; forming a first buffer layer on the first fin-shaped structure and the second fin-shaped structure; removing the first buffer layer on the first region; and performing a curing process so that a width of the first fin-shaped structure is different from a width of the second fin-shaped structure.

10 Claims, 5 Drawing Sheets

METHOD FOR FABRICATING SEMICONDUCTOR DEVICE

BACKGROUND OF THE INVENTION

1. Field of the Invention

The invention relates to a method for fabricating semiconductor device, and more particularly, to a method for fabricating fin-shaped structures having different widths.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of: providing a substrate having a first region and a second region; forming a first fin-shaped structure on the first region and a second fin-shaped structure on the second region; forming a first buffer layer on the first fin-shaped structure and the second fin-shaped structure; removing the first buffer layer on the first region; and performing a curing process so that a width of the first fin-shaped structure is different from a width of the second fin-shaped structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
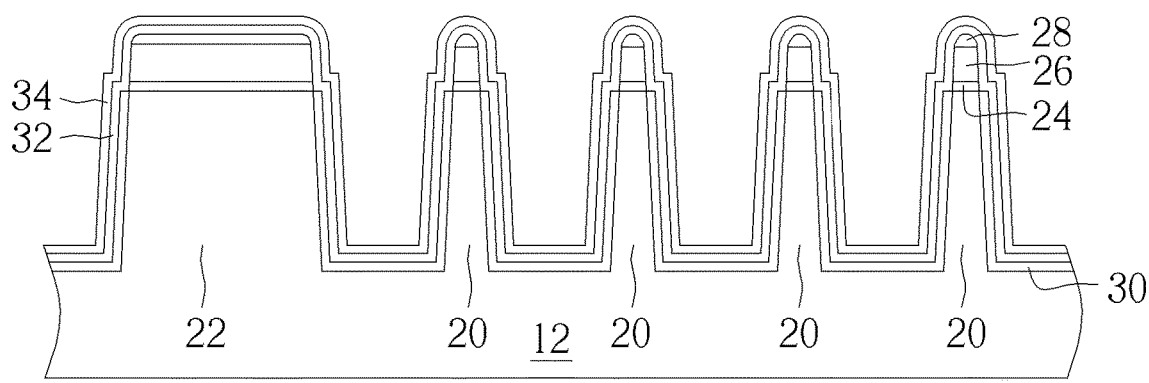
FIGS. 1-7 illustrate a method for fabricating semiconductor device according to an embodiment of the present invention.

Referring to FIGS. 1-7, FIGS. 1-7 illustrate a method for fabricating semiconductor device according to an embodiment of the present invention. As shown in FIG. 1, a substrate 12, such as a silicon substrate or silicon-on-insulator (SOI) substrate is provided, and a first region 14, a second region 16, and a third region 18 are defined on the substrate 12. In this embodiment, the first region 14 and the second region 16 are preferably active regions used for fabricating NMOS transistor and/or PMOS transistor in the later process while third region 18 is preferably a peripheral region. Next, a plurality of fin-shaped structures 20 are formed on the first region 14 and the second region 16 and a base 22 is formed on the third region 1, in which one or more patterned mask including a patterned liner 24, a patterned liner 26, and a patterned hard mask 28 are formed on each of the fin-shaped structures 20 and the base 22.

According to an embodiment of the present invention, the fin-shaped structures 20 and the base 22 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structures 20 and the base 22 could also be obtained by first forming a patterned mask (not shown) on the substrate, 12, and through an etching process, the pattern of the patterned mask is transferred to the substrate 12 to form the fin-shaped structures 20 and the base 22. Moreover, the formation of the fin-shaped structures 20 and the base 22 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structures 20 and the base 22. These approaches for forming fin-shaped structure are all within the scope of the present invention.

Next, an in-situ steam generation (ISSG) process is conducted to form a liner 30 on the fin-shaped structures 20 and the base 22. Preferably, the liner 30 is made of material including but not limited to for example silicon oxide and the liner 30 is not only disposed on the sidewalls of the fin-shaped structures 20 and the base 22 but also on the surface of the substrate 12.

Next, an atomic layer deposition (ALD) process is conducted to form a liner 32 on the fin-shaped structures 20 on first region 14 and second region 16 and also on the base 22 on third region 18, and a buffer layer 34 is formed on the surface of the liner 32 thereafter. In this embodiment, the liner 32 preferably includes silicon oxide and the buffer layer 34 is preferably a silicon buffer film (SBF) or more specifically an amorphous silicon layer, but not limited thereto.

Figure 2:
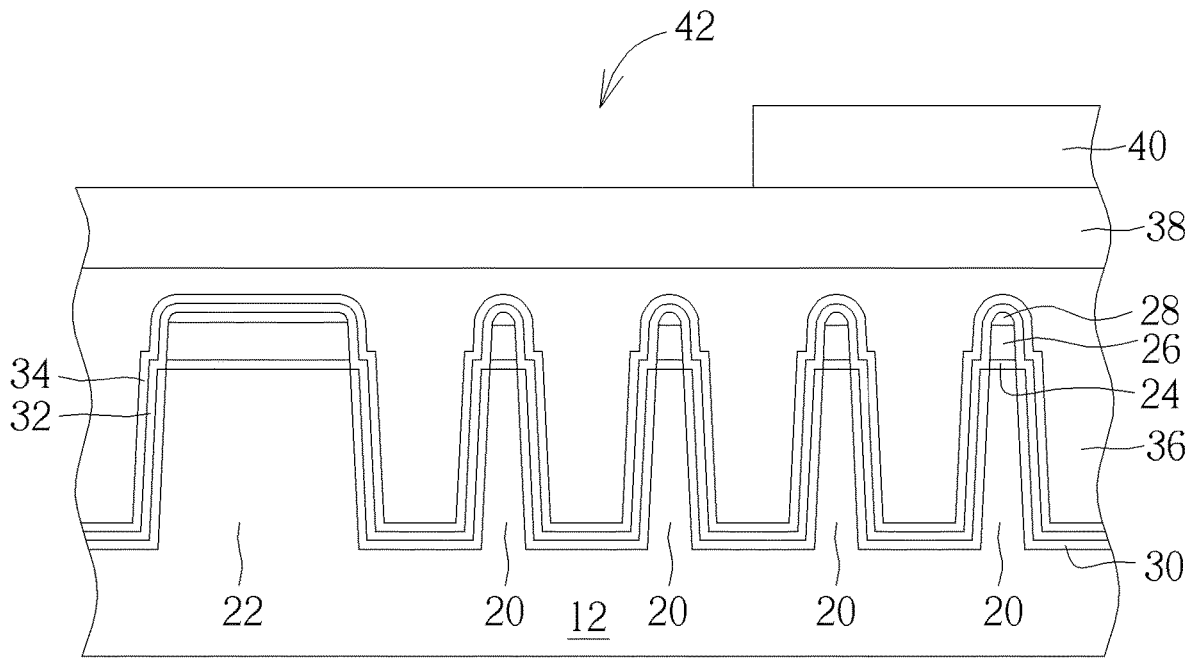

Next, as shown in FIG. 2, a composite mask layer including an organic dielectric layer (ODL) 36, a silicon-containing hard mask bottom anti-reflective coating (SHB) 38 and a patterned resist 40 on the substrate 12. Preferably, the ODL 36 is disposed to cover the fin-shaped structures 20 on both first region 14 and second region 16 and the base 22 on third region 18 and the patterned resist 40 is disposed on the second region 16, in which the patterned resist 40 includes an opening 42 exposing the SHB 38 on the first region 14 and third region 18.

Figure 3:
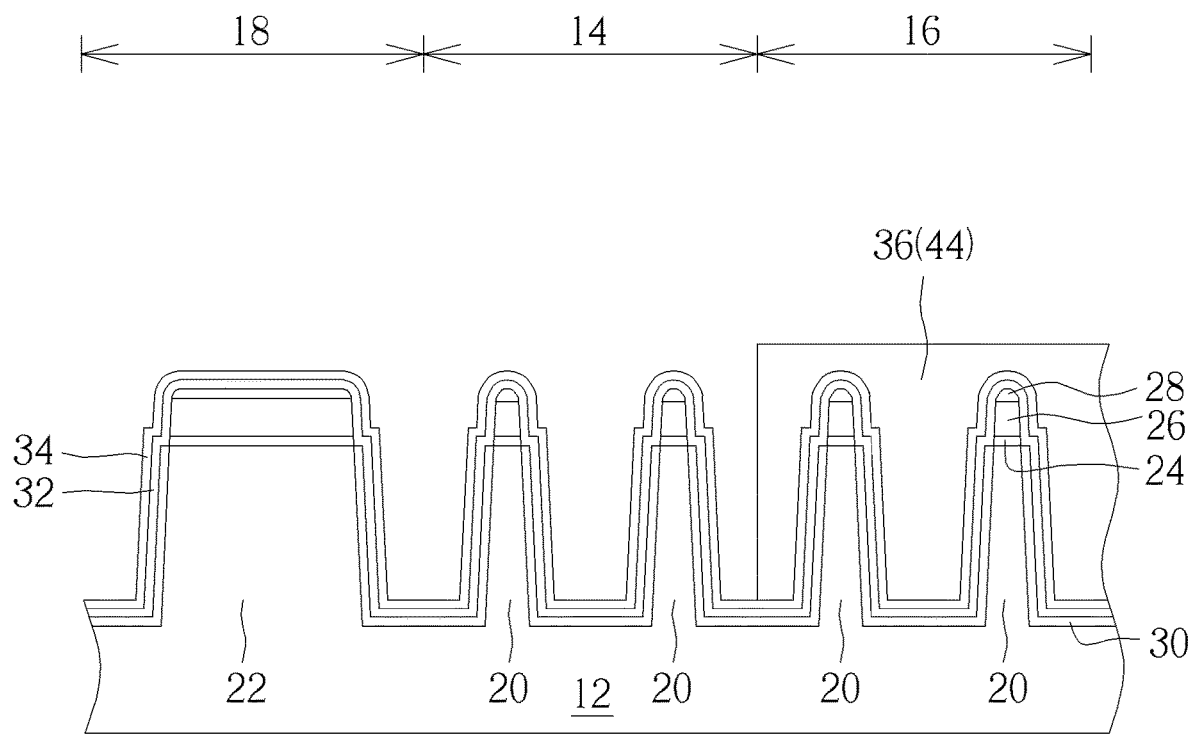

Next, as shown in FIG. 3, an etching process is conducted by using the patterned resist 40 as mask to remove part of the SHB 38 and part of the ODL 36 on first region 14 and third region 18 to expose the buffer layer 34 on the first region 14 and third region 18. The patterned resist 40 and the remaining SHB 38 are removed thereafter so that the remaining ODL 36 on the second region 16 becomes another patterned mask 44.

It should be noted that the etching process conducted in FIG. 3 preferably uses an etching gas having high selectivity to silicon material for removing part of the ODL 36 so that none of the buffer layer 34 on the first region 14 and third region 18 is damaged. In this embodiment, the etching gas used for removing part of the SHB 38 and part of the ODL 36 could include nitrogen gas, hydrogen gas, or combination thereof.

Figure 4:
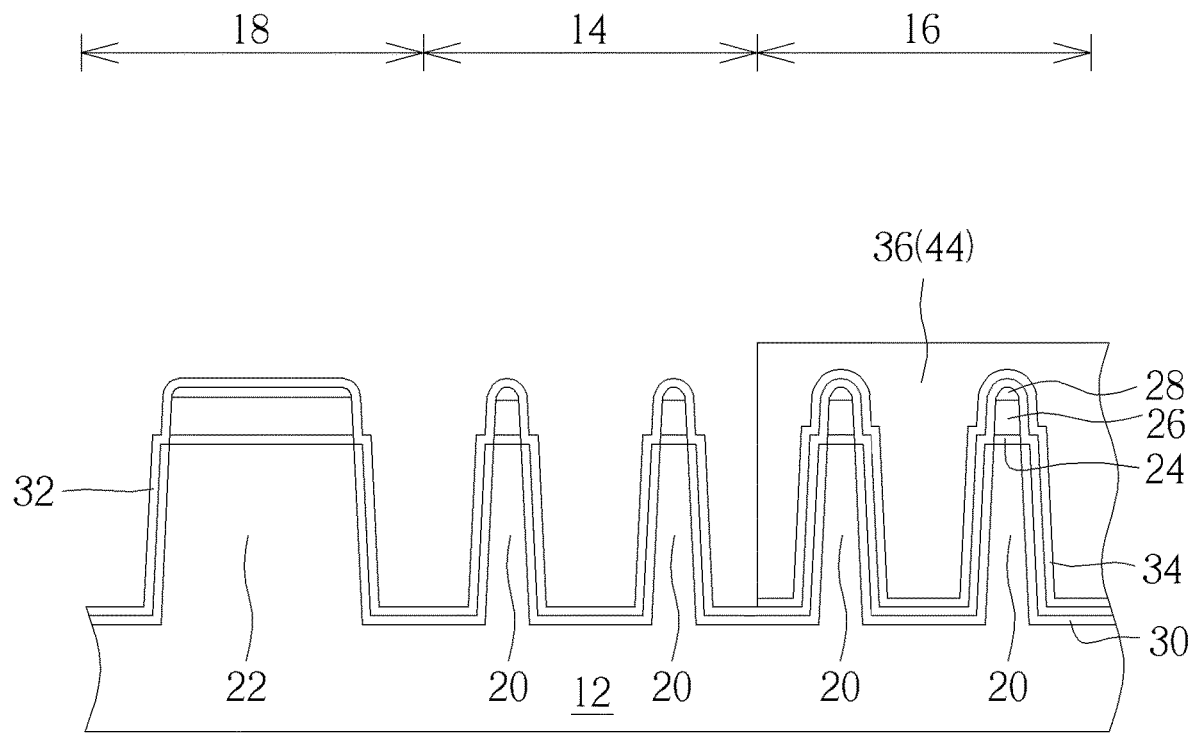

Next, as shown in FIG. 4, another etching process is conducted by using the remaining ODL 36 or patterned mask 44 on the second region 16 as mask to remove the buffer layer 34 on the first region 14 and third region 18 for exposing the liner 32 underneath.

Figure 5:
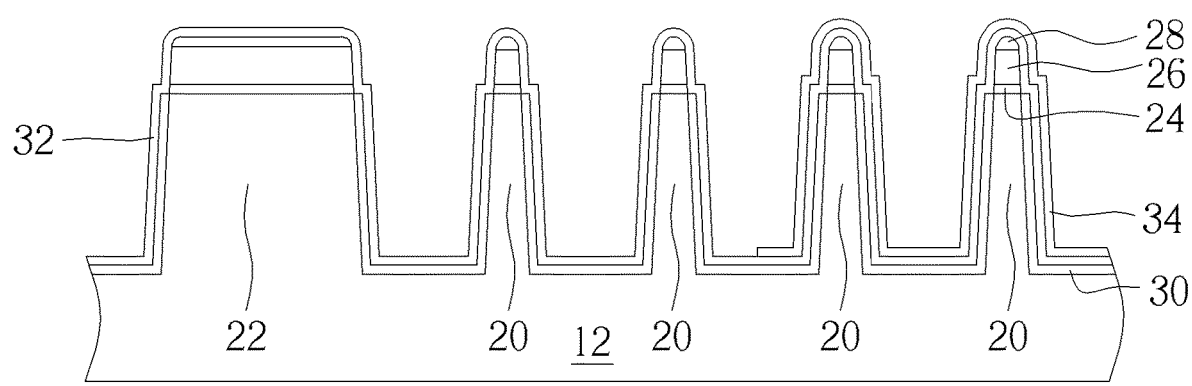

Next, as shown in FIG. 5, the patterned mask 44 on the second region 16 is removed to expose the buffer layer 34 underneath. At this stage, only a single liner 32 is disposed on the fin-shaped structures 20 and base 22 on the first region 14 and third region 18 while a liner 32 and a buffer layer 34 are disposed on the fin-shaped structures 20 on the second region 16.

Figure 6:
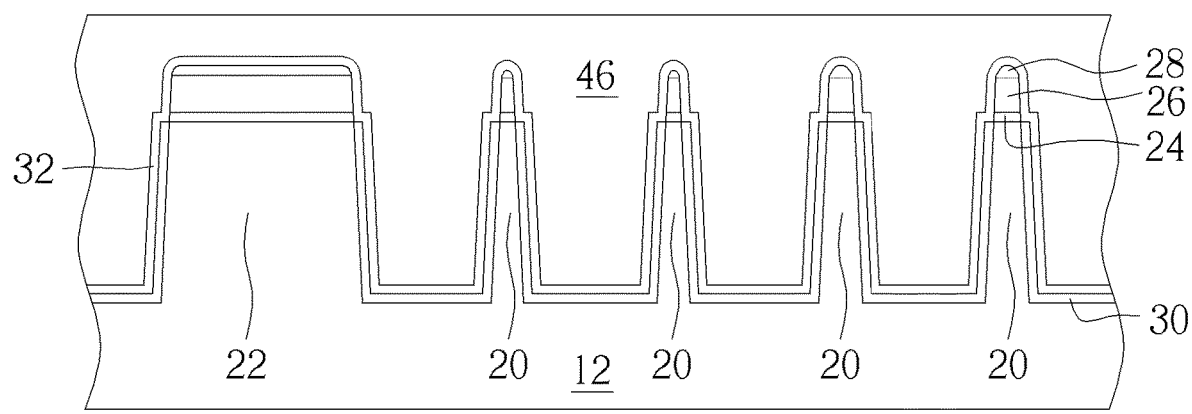

Next, as shown in FIG. 6, a shallow trench isolation (STI) process is conducted by first conducting a flowable chemical vapor deposition (FCVD) process to form an insulating layer 46 made of silicon oxide on the substrate 12 and covering the fin-shaped structures 20 on first region 14 and second region 16 and the base 22 on third region 18. Next, a curing process 48 or more specifically an ultraviolet (UV) curing process is conducted to improve the structural rigidity of the fin-shaped structures while altering the widths of the fin-shaped structures 20 so that the fin-shaped structures 20 on the first region 14 and the fin-shaped structures 20 on the second region 16 would have different widths.

It should be noted that since no buffer layer 34 is disposed on the fin-shaped structures 20 on the first region 14 while a single layer of buffer layer 34 is disposed on the fin-shaped structures 20 on the second region 16, more of the fin-shaped structures 20 on the first region 14 would be consumed while less of the fin-shaped structures 20 on the second region 16 would be consumed during the curing process 48 so that the width of each of the fin-shaped structures 20 on the first region 14 would be slightly less than the width of each of the fin-shaped structures 20 on the second region 16 after the curing process 48. Since the size of the base 22 on third region 18 is significantly greater than the size of the fin-shaped structures 20 on either first region 14 or second region 16, the width of the base 22 preferably remains unchanged relative to the fin-shaped structures 20 on either first region 14 or second region 16 after the curing process 48 even if no buffer layer 34 were disposed on the base 22. Moreover, it should be noted that the buffer layer 34 made of amorphous silicon is preferably transformed into silicon oxide during the curing process 48 thereby combining or uniting with the insulating layer 46 into one unit. As a result, the buffer layer 34 becomes invisible in FIG. 6 and the liner 32 on the fin-shaped structures 20 and base 22 then contacts the insulating layer 46 directly.

Figure 7:
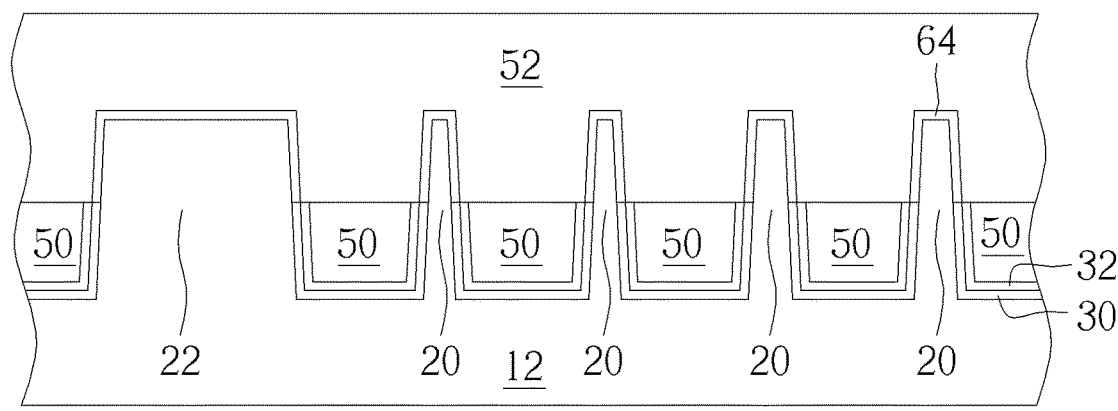

Next, as shown in FIG. 7, a planarizing process such as a chemical mechanical polishing (CMP) process is conducted along with an optional etching process to remove part of the insulating layer 46, part of the liner 32, part of the liner 30, and the multiple liners and hard mask on the fin-shaped structures 20 and the base 22 so that the top surface of the remaining insulating layer 46 is slightly lower than the top surfaces of the fin-shaped structures 20 and the base 22. This forms a STI 50 between fin-shaped structures 20 and the base 22. Next, transistor fabrication process could be conducted by forming a gate dielectric layer 64 and a gate material layer 52 made of polysilicon layer on the fin-shaped structure 20 and the base 22, patterning or using photo-etching process to pattern the gate material layer 52 for forming gate structures, and then forming transistor elements such as spacers and source/drain regions adjacent to two sides of the gate structures. This completes the fabrication of a semiconductor device according to an embodiment of the present invention.

Figure 8:
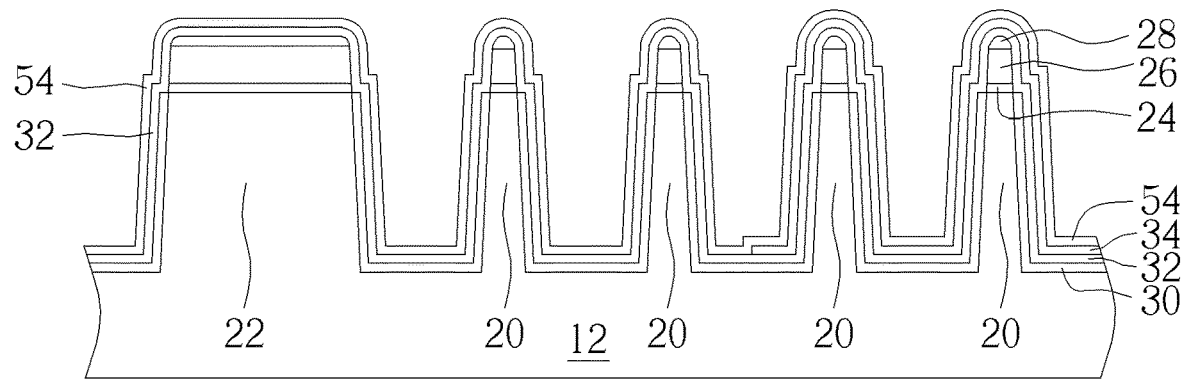
FIGS. 8-10 illustrate a method for fabricating a semiconductor device according to an embodiment of the present invention.
Figure 9:
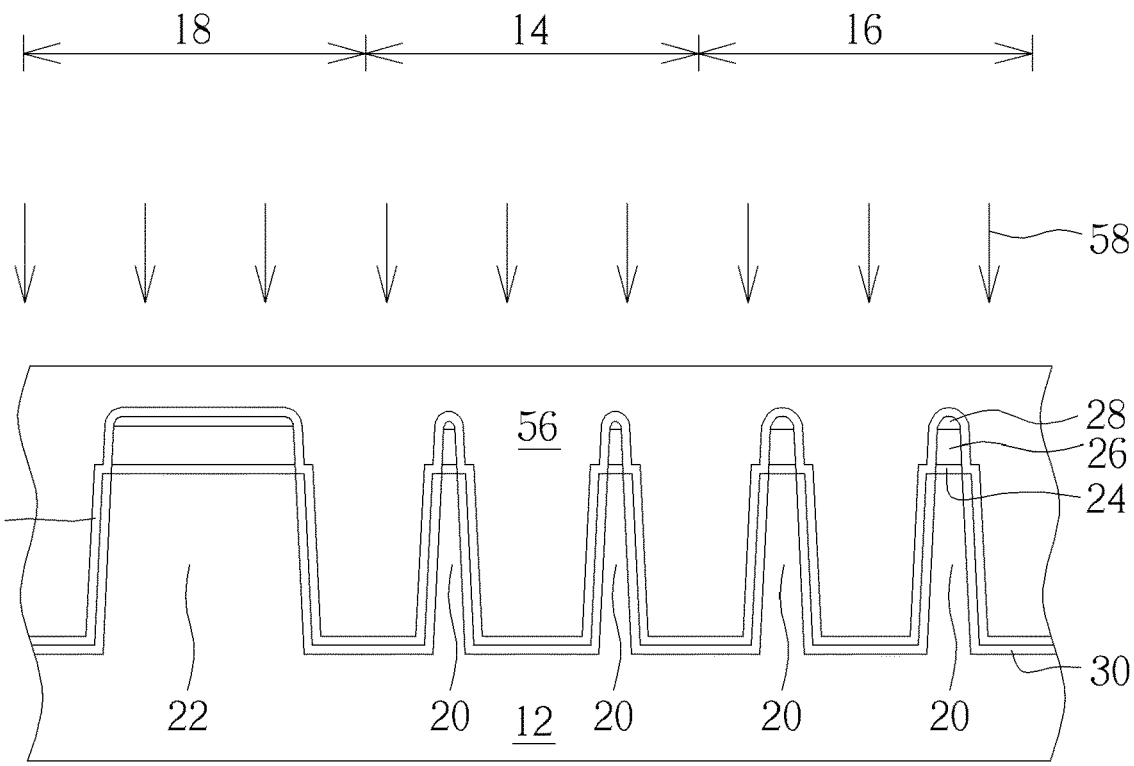
Figure 10:
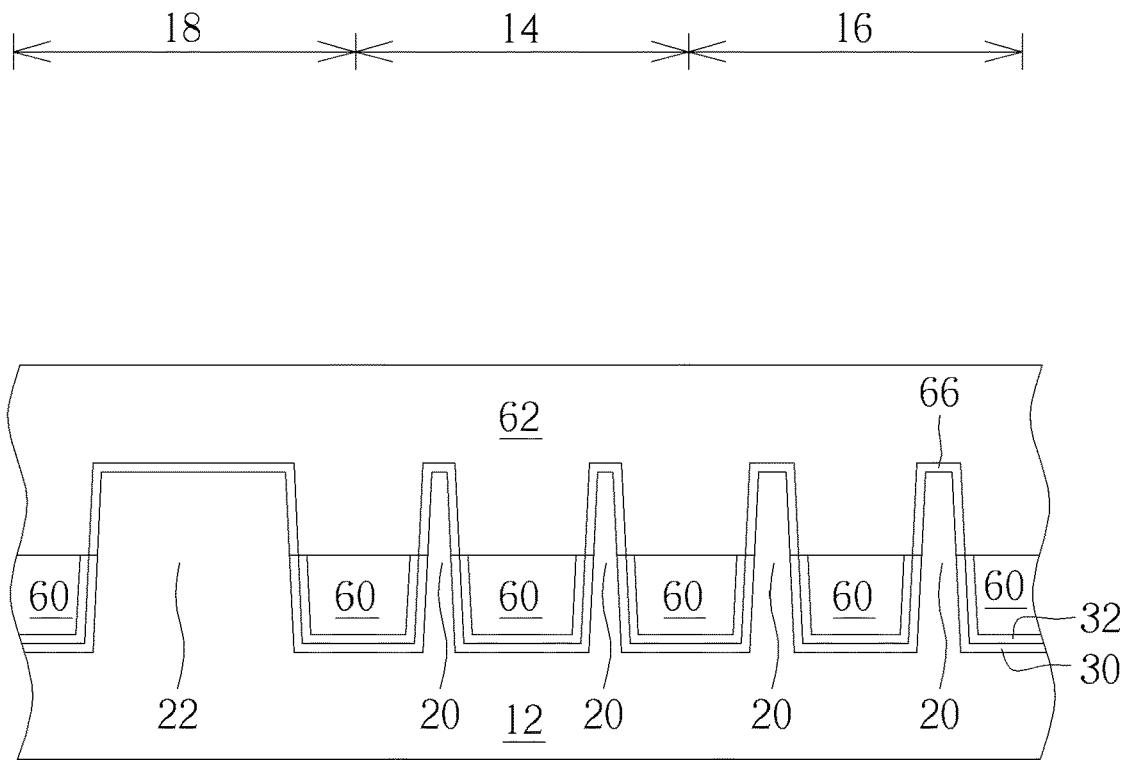

Referring to FIGS. 8-10, FIGS. 8-10 illustrate a method for fabricating a semiconductor device according to an embodiment of the present invention. As shown in FIG. 8, it would be desirable to directly form another buffer layer 54 on the first region 14, second region 16, and third region 18 after the patterned mask 44 on the second region 16 is removed in FIG. 5, in which the buffer layer 54 on the first region 14 and third region 18 is disposed on the surface of the liner 32 while the buffer layer 54 on the second region 16 is disposed on the surface of the remaining buffer layer 34. In this embodiment, the buffer layer 54 and the buffer layer 34 deposited previously are made of same material such as amorphous silicon, but not limited thereto.

Next, as shown in FIG. 9, a shallow trench isolation (STI) process is conducted by first conducting a flowable chemical vapor deposition (FCVD) process to form an insulating layer 56 made of silicon oxide on the substrate 12 to cover the fin-shaped structures 20 on first region 14 and second region 16 and the base 22 on third region 18. Next, a curing process 58 or more specifically an ultraviolet (UV) curing process is conducted to improve the structural rigidity of the fin-shaped structures while altering the widths of the fin-shaped structures 20 so that the fin-shaped structures 20 on the first region 14 and the fin-shaped structures 20 on the second region 16 have different widths.

Similar to the aforementioned embodiment, since only a single buffer layer 34 is disposed on the fin-shaped structures 20 on the first region 14 while two buffer layers 34, 54 are disposed on the fin-shaped structures 20 on the second region 16, more of the fin-shaped structures 20 on the first region 14 would be consumed and less of the fin-shaped structures 20 on the second region 16 would be consumed during the curing process 58 so that the width of each of the fin-shaped structures 20 on the first region 14 would be slightly less than the width of each of the fin-shaped structures 20 on the second region 16 after the curing process 58. Since the size of the base 22 on third region 18 is significantly greater than the size of each of the fin-shaped structures 20 on both first region 14 and second region 16, the width of the base 22 preferably remains unchanged relative to the fin-shaped structures 20 on the first region 14 and the second region 16 after the curing process 58. Moreover, the buffer layers 34, 54 made of amorphous silicon are preferably transformed into silicon oxide during the curing process 58 and combined with the insulating layer 56 into one unit. As a result, the buffer layers 34, 54 become invisible in FIG. 9 and the liner 32 on the fin-shaped structures 20 and base 22 then contacts the insulating layer 56 directly.

Next, as shown in FIG. 10, a planarizing process such as a chemical mechanical polishing (CMP) process is conducted along with an optional etching process to remove part of the insulating layer 56, part of the liner 32, part of the liner 30, and the multiple liners and hard mask on the fin-shaped structures 20 and the base 22 so that the top surface of the remaining insulating layer 56 is slightly lower than the top surfaces of the fin-shaped structures 20 and the base 22. This forms a STI 60 between fin-shaped structures 20 and the base 22. Next, transistor fabrication process could be conducted by forming a gate dielectric layer 66 and a gate material layer 62 made of polysilicon layer on the fin-shaped structure 20 and the base 22, patterning or using photo-etching process to pattern the gate material layer 62 for forming gate structures, and then forming transistor elements such as spacers and source/drain regions adjacent to two sides of the gate structures. This completes the fabrication of a semiconductor device according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    providing a substrate having a first region and a second region;
    forming a first fin-shaped structure on the first region and a second fin-shaped structure on the second region;
    forming a first liner on the first fin-shaped structure and the second fin-shaped structure;
    forming a first buffer layer on the first liner;
    removing the first buffer layer on the first region;
    forming an insulating layer on the first fin-shaped structure and the second fin-shaped structure; and
    performing a curing process to combine the first buffer layer and the insulating layer into one unit while the first liner is on the first fin-shaped structure and the second fin-shaped structure and a width of the first fin-shaped structure is different from a width of the second fin-shaped structure.

2. The method of claim 1, further comprising:
    forming the first buffer layer on the first liner;
    forming a patterned mask on the second region; and
    using the patterned mask to remove part of the first buffer layer on the first region.

3. The method of claim 2, further comprising performing an atomic layer deposition (ALD) process to form the first liner.

4. The method of claim 2, further comprising forming a second liner on sidewalls of the first fin-shaped structure and the second fin-shaped structure before forming the first liner.

5. The method of claim 4, further comprising performing an in-situ steam generation (ISSG) process to form the second liner.

6. The method of claim 4, wherein the first liner and the second liner comprise same material.

7. The method of claim 4, wherein the first liner and the second liner comprise silicon oxide.

8. The method of claim 2, further comprising:
    removing the patterned mask;
    forming a second buffer layer on the first region and the second region;
    forming an insulating layer on the second buffer layer;
    performing the curing process after forming the insulating layer.

9. The method of claim 8, wherein the first buffer layer and the second buffer layer comprise same material.

10. The method of claim 8, wherein the first buffer layer and the second buffer layer comprise amorphous silicon.

* * * * *